(12) United States Patent
Kim et al.

(10) Patent No.: US 9,935,133 B2
(45) Date of Patent: Apr. 3, 2018

(54) DISPLAY DEVICE AND MANUFACTURING METHOD THEREOF

(71) Applicant: SAMSUNG DISPLAY CO., LTD., Yongin-si, Gyeonggi-do (KR)

(72) Inventors: Deuk Jong Kim, Cheonan-si (KR); Hyo Jin Kim, Seoul (KR); Won Mo Park, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/072,747

(22) Filed: Mar. 17, 2016

(65) Prior Publication Data
US 2016/0276373 A1 Sep. 22, 2016

(30) Foreign Application Priority Data
Mar. 17, 2015 (KR) .......................... 10-2015-0036961

(51) Int. Cl.
*H01L 27/12* (2006.01)
(52) U.S. Cl.
CPC ................ *H01L 27/1244* (2013.01)
(58) Field of Classification Search
CPC .................................................. H01L 27/1244
See application file for complete search history.

(56) References Cited

U.S. PATENT DOCUMENTS

2008/0017855 A1*  1/2008  Kim ...................... G02F 1/1309
                                                                                             257/48
2010/0207226 A1*  8/2010  Park ................... H01L 27/14623
                                                                                             257/432

FOREIGN PATENT DOCUMENTS

| KR | 10-0543029 | 5/2006 |
| KR | 10-2008-0076459 A | 8/2008 |
| KR | 10-2011-0121419 A | 11/2011 |
| KR | 10-1233348 | 2/2013 |

* cited by examiner

*Primary Examiner* — Marc Armand
(74) *Attorney, Agent, or Firm* — Lewis Roca Rothgerber Christie LLP

(57) ABSTRACT

A display device includes: a first substrate comprising a display area including a plurality of pixels, and a peripheral area around the display area; a plurality of driving signal transmission lines on the first substrate and arranged in the peripheral area; a first insulating layer on the first substrate and arranged under the plurality of driving signal transmission lines; and a second insulating layer on a portion of the plurality of driving signal transmission lines and arranged in the display area, and the first insulating layer includes a trench between two driving signal transmission lines adjacent to each other among the plurality of driving signal transmission lines, and an edge portion of the second insulating layer overlaps the trench.

20 Claims, 10 Drawing Sheets

DISPLAY DEVICE AND MANUFACTURING METHOD THEREOF

CROSS-REFERENCE TO RELATED APPLICATION

This application claims priority to and the benefit of Korean Patent Application No. 10-2015-0036961, filed on Mar. 17, 2015 in the Korean Intellectual Property Office, the entire content of which is incorporated herein by reference.

BACKGROUND

1. Field

Aspects of embodiments of the present invention relate to a display device and a manufacturing method of the display device.

2. Description of the Related Art

As an area of a display device is increased, a signal line is elongated, and accordingly resistance of the signal line is increased. As described above, if the resistance of the signal line is increased, a signal delay or a voltage drop may be generated, and to solve these problems, it is necessary to form the signal line using a material having low, resistivity. Accordingly, silver (Ag) as one among the materials having low resistivity may be used to form a wire such as a data line.

However, silver (Ag) ions may remain after the silver (Ag) is deposited and then spread in a boundary portion of an insulating layer disposed near the signal line, thereby causing a wiring short between adjacent signal lines.

The above information disclosed in this Background section is only for enhancement of understanding of the background of the invention and therefore it may contain information that does not form the prior art that is already known in this country to a person of ordinary skill in the art.

SUMMARY

According to an aspect of embodiments of the present invention, a display device may prevent or substantially prevent a wiring short generated between adjacent signal lines by silver (Ag) remaining on an edge of an insulating layer disposed near a signal line.

According to one or more exemplary embodiments of the present invention, a display device includes: a first substrate comprising a display area including a plurality of pixels, and a peripheral area around the display area; a plurality of driving signal transmission lines on the first substrate and arranged in the peripheral area; a first insulating layer on the first substrate and arranged under the plurality of driving signal transmission lines; and a second insulating layer on a portion of the plurality of driving signal transmission lines and arranged in the display area, and the first insulating layer includes a trench between two driving signal transmission lines adjacent to each other among the plurality of driving signal transmission lines, and an edge portion of the second insulating layer overlaps the trench.

The driving signal transmission lines may include silver (Ag).

Each of the driving signal transmission lines may include a first film, a second film disposed on the first film, and a third film disposed on the second film.

The second film may include silver (Ag).

The first film and the third film may include titanium (Ti).

The display device may further include a data line disposed on the first substrate, and a driving signal transmission line of the plurality of driving signal transmission lines may be connected to the data line.

The trench in the first insulating layer may be in plural, and the edge portion of the second insulating layer may be in plural and overlap at least a portion of the plurality of trenches.

The display device may further include a third insulating layer under the first insulating layer, and the trench may be in the first insulating layer and the third insulating layer.

According to an aspect of embodiments of the present invention, in a display device, a wiring short generated between adjacent signal lines due to silver (Ag) remaining on the edge of the insulating layer disposed around the signal line may be prevented or substantially prevented.

Figure 1:
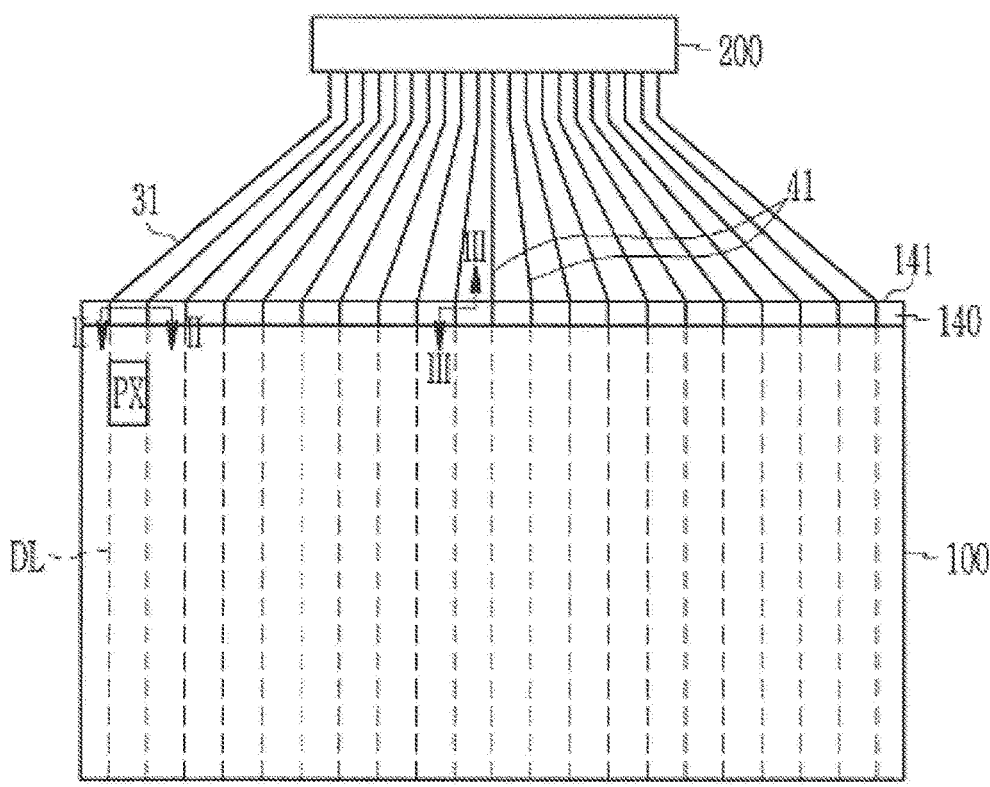
FIG. 1 is a schematic layout view of a display device according to an exemplary embodiment of the present invention.

| Description of Reference Numerals Indicating Some Elements in the Drawings | |
|---|---|
| 100: display area | 110: insulation substrate |
| 120: gate insulating layer | 130: first insulating layer |
| 140: second insulating layer | 141: edge portion |
| 200: driver | 31: driving signal transmission line |
| 32a: metal nanoparticles | 41: trench |

DETAILED DESCRIPTION

Aspects and features of some exemplary embodiments of the present invention are described more fully herein with reference to the accompanying drawings, in which some exemplary embodiments of the present invention are shown. The present invention may, however, be embodied in different forms and should not be construed as limited to the embodiments set forth herein. Rather, these embodiments are provided in order to convey the scope of the present invention to those skilled in the art. As those skilled in the art would realize, the described embodiments may be modified in various different ways, all without departing from the spirit or scope of the present invention.

In the drawings, the thickness of layers, films, panels, regions, etc., may be exaggerated for clarity. Like reference numerals designate like elements throughout the specification. It will be understood that when an element such as a layer, film, region, or substrate is referred to as being "on" another element, it can be directly on the other element or one or more intervening elements may also be present. In contrast, when an element is referred to as being "directly on" another element, there are no intervening elements present.

Figure 2:
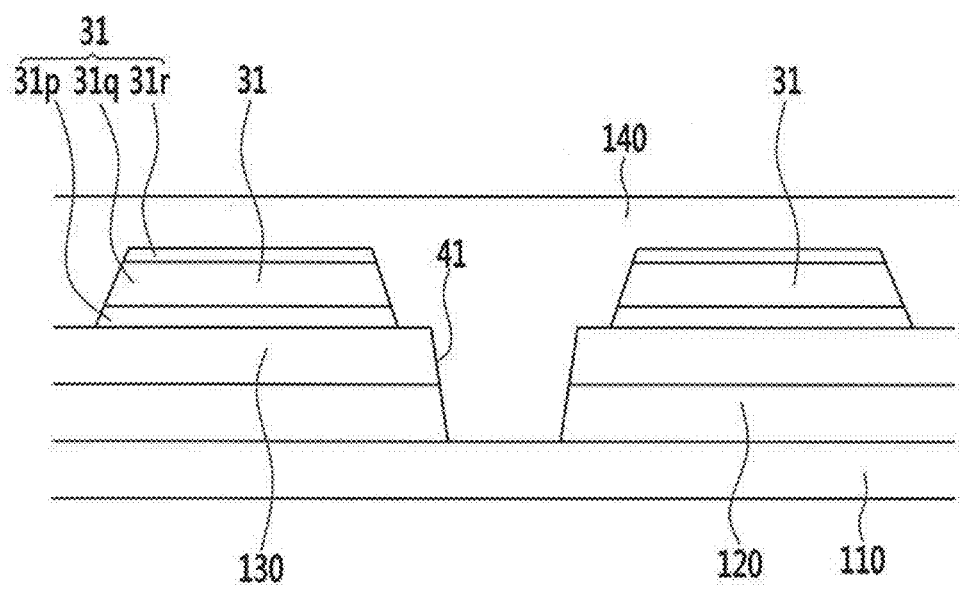
FIG. 2 is a cross-sectional view of the display device of FIG. 1 taken along the line II-II.
Figure 3:
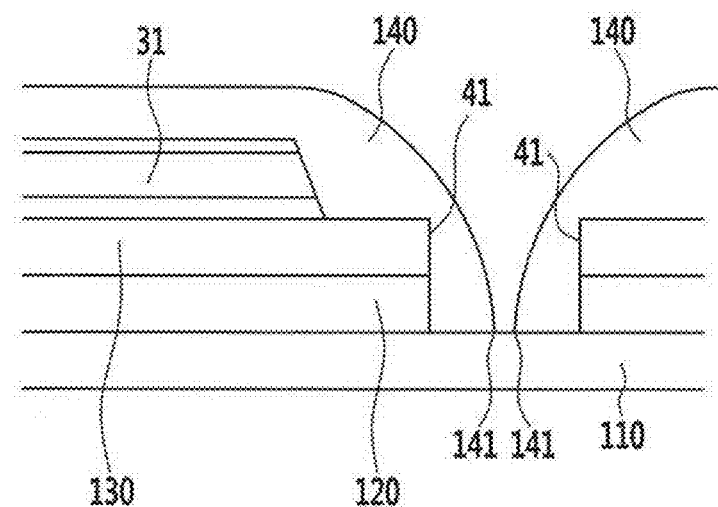
FIG. 3 is a cross-sectional view of the display device of FIG. 1 taken along the line III-III.

A display device according to an exempla embodiment of the present invention will be described with reference to FIG. 1 to FIG. 3 FIG. 1 is a schematic layout view of a display device according to an exemplary embodiment of the present invention; FIG. 2 is a cross-sectional view of the display device of FIG. 1, taken along the line II-II; and FIG. 3 is a cross-sectional view of the display device of FIG. 1, taken along the line III-III.

Referring to FIG. 1 and FIG. 2, the display device according to the present exemplary embodiment includes a display area 100 including a plurality of pixels PX, a driver 200 disposed near the display area 100 and transmitting a driving signal to the display area 100, and a plurality of driving signal transmission lines 31 disposed between the display area 100 and the driver 200.

Referring to FIG. 2 and FIG. 1 to FIG. 3, a gate insulating layer 120 is disposed on an insulation substrate 110, and a first insulating layer 130 is disposed on the gate insulating layer 120. The plurality of driving signal transmission lines 31 is disposed on the first insulating layer 130. Each of the plurality of driving signal transmission lines 31 may include a first film 31p, a second film 31q disposed on the first film 31p, and a third film 31r disposed on the second film 31q. The first film 31p and the third film 31r may include titanium (Ti), and the second film 31q may include silver (Ag).

A second insulating layer 140 is disposed on the display area 100 and a portion of the driving signal transmission lines 31. The gate insulating layer 120 and the first insulating layer 130 include a trench 41 disposed between two driving signal transmission lines 31 adjacent to each other and overlapping an edge of the second insulating layer 140.

In an exemplary embodiment, the trench 41 overlaps an edge portion 141 of the second insulating layer 140 disposed between two driving signal transmission lines 31 adjacent to each other, the trench 41 is disposed between two adjacent driving signal transmission lines 31, and the trench 41 is formed in the gate insulating layer 120 and the first insulating layer 130.

Accordingly, the edge portion 141 of the second insulating layer 140 disposed between two adjacent driving signal transmission lines 31 among the edges of the second insulating layer 140 partially disposed on the driving signal transmission line 31 is disposed in the trench 41. That is, the edge portion 141 of the second insulating layer 140 disposed between two adjacent driving signal transmission lines 31 overlaps the trench 41. In this way, since the edge portion 141 of the second insulating layer 140 disposed between two adjacent driving signal transmission lines 31 is disposed in the trench 41 disposed in the gate insulating layer 120 and the first insulating layer 130 disposed under the driving signal transmission line 31, a surface height of the edge portion 141 of the second insulating layer 140 disposed between the two adjacent driving signal transmission lines 31 is lower than the surface of the first insulating layer 130. Accordingly, although the edge 141 of the second insulating layer 140 disposed between the two adjacent driving signal transmission lines 31 may be lifted, the lifting is not higher than the surface height of the first insulating layer 130.

The driving signal transmission line 31 may be connected to a data line DL disposed in the display area 100.

Figure 4:
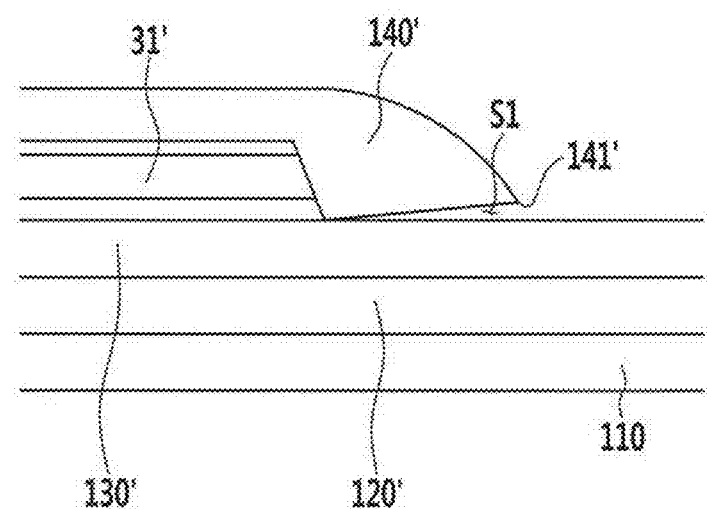
FIG. 4 is a cross-sectional view of a boundary portion of an insulating layer of a conventional display device.
Figure 5:
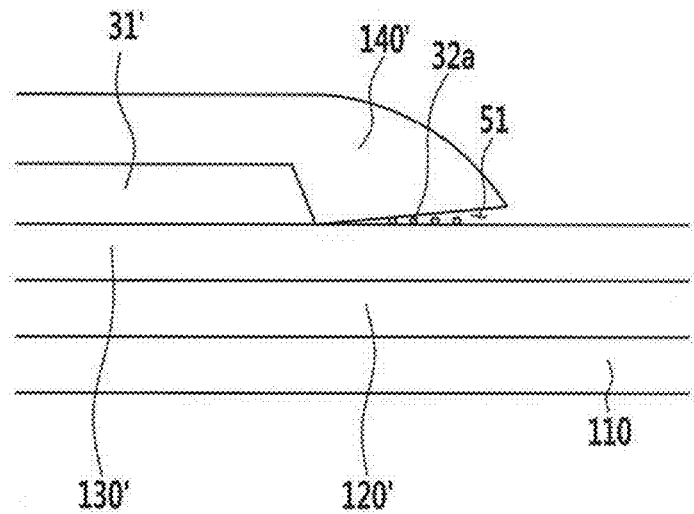
FIG. 5 and FIG. 6 are cross-sectional views of a boundary portion of an insulating layer of a conventional display device.
Figure 6:
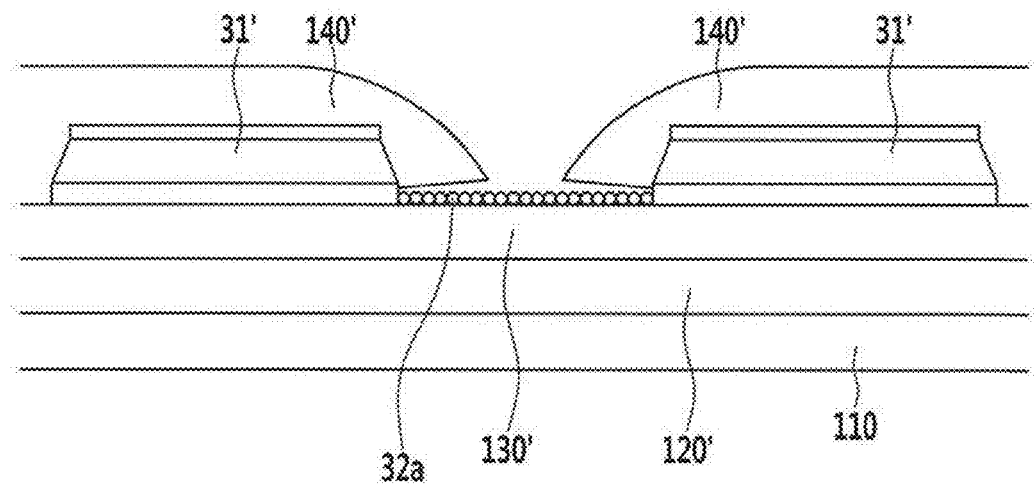
Figure 7:
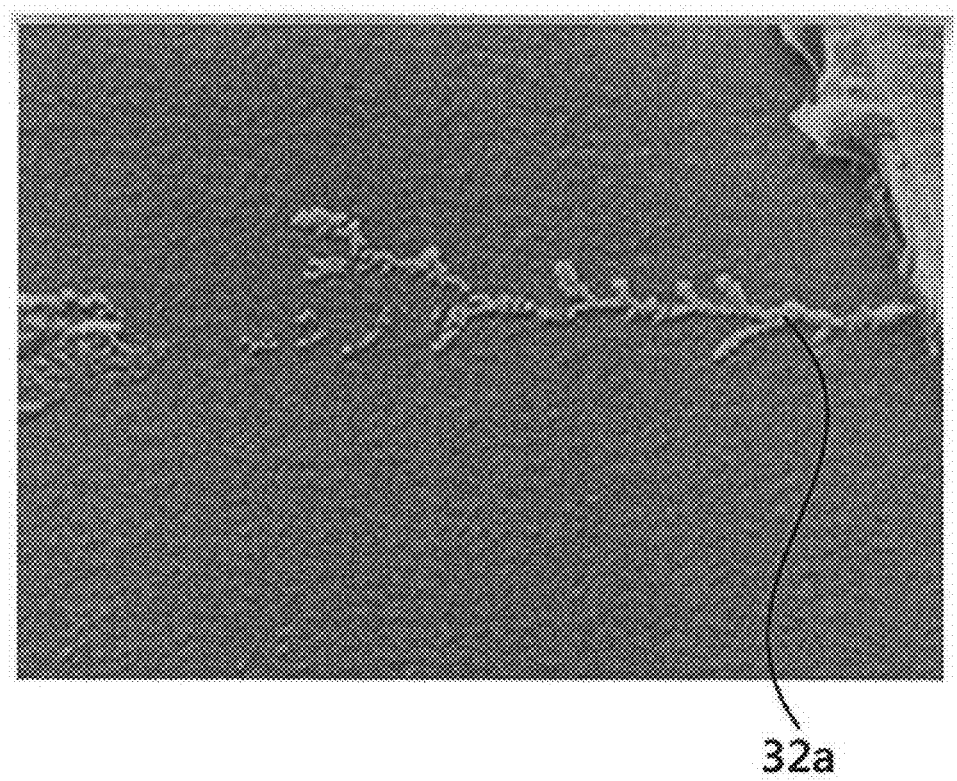
FIG. 7 is an electron microscopic photograph of a dendrite phenomenon of metal nanoparticles.

The edge of a second insulating layer 140' of a conventional display device will be described with reference to FIG. 4 to FIG. 7. FIG. 4 is a cross-sectional view of a boundary portion of an insulating layer of a conventional display device; FIG. 5 and FIG. 6 are cross-sectional views of a boundary portion of an insulating layer of a conventional display device; and FIG. 7 is an electron microscopic photograph of a dendrite phenomenon of metal nanoparticles.

Referring to FIG. 4, at a separation portion 51 when forming the second insulating layer 140' on a first insulating layer 130' over a gate insulating layer 120', an edge portion 141' of the second insulating layer 140' may be lifted.

However, according to the display device according to an exemplary embodiment of the present invention, as shown in FIG. 3, when forming the second insulating layer 140 on the first insulating layer 130, the edge portion 141 disposed between two adjacent driving signal transmission lines 31 among the edge of the second insulating layer 140 overlaps the trench 41 formed in the gate insulating layer 120 and the first insulating layer 130.

Accordingly, although the edge of the second insulating layer 140 may be lifted, the edge portion 141 disposed between two adjacent driving signal transmission lines 31 among the edge of the second insulating layer 140 is disposed in the plurality of trenches 41. Accordingly, the separation portion 51 of the edge portion 141 disposed between two adjacent driving signal transmission lines 31 is disposed in the trench 41. Therefore, although the edge of the second insulating layer 140 is lifted, the height of the separation portion 51 of the edge portion 141 of the second insulating layer 140 is lower than the height of the surface of the first insulating layer 130.

When forming an additional metal layer on the second insulating layer 140, the partial component of the driving signal transmission line 31 that is not covered by the second insulating layer 140 reacts with an etchant to form the additional metal layer, and may remain near the edge of the second insulating layer 140. This will be described in detail with reference to FIG. 5 and FIG. 6.

FIG. 5 and FIG. 6 are cross-sectional views of boundary portion of an insulating layer of a convention al display device.

First, referring to FIG. 5, when forming the second insulating layer 140' on the first insulating layer 130', the edge of the second insulating layer 140' is lifted such that the separation portion 51 is generated between the edge of the second insulating layer 140' and the first insulating layer 130'. In this case, after forming the second insulating layer 140', when forming the additional metal layer on the second insulating layer 140', the metal component of a driving signal transmission line 31' that is not covered by the second insulating layer 140' may remain in the separation portion 51 under the edge of the lifted second insulating layer 140' with a nanoparticle shape. In detail, metal nanoparticles 32a of the metal component of the driving signal transmission line 31' remain in the separation, portion 51 between the first insulating layer 130' and the edge of the second insulating layer 140'.

The metal nanoparticles 32a may be a component included in the driving signal transmission line 31', for example, aluminum (Al).

In this way, the metal nanoparticles 32a remaining under the edge of the second insulating layer 140' are spread between the adjacent driving signal transmission lines 31' by the dendrite phenomenon in a condition of high temperature or high moisture for the display device, and as shown in FIG. 6, the adjacent driving signal transmission lines 31' may be shorted.

Next, the dendrite phenomenon of the metal nanoparticles 32a disposed under the edge of the lifted second insulating layer 140' will be described with reference to FIG. 7. FIG. 7 is an electron, microscopic photograph of a dendrite phenomenon of metal nanoparticles.

Referring to FIG. 7, different from the display device according to an exemplary embodiment of the present invention, when forming the second insulating layer 140' without forming the trench 41 overlapping the edge of the second insulating layer 140', it may be confirmed that the metal nanoparticles 32a disposed under the edge 141' of the second insulating layer 140' are gradually spread.

As described above, according to the conventional display device, since the second insulating layer 140' is disposed on the first insulating layer 130' and the height of the lower surface of the edge of the second insulating layer 140' is approximately the same as the height of the first insulating layer 130' the edge of the second insulating layer 140' is lifted such that the adjacent driving signal transmission lines 31' disposed on the first insulating layer 130' may be shorted by the diffusion of the metal nanoparticles 32a remaining under the edge of the second insulating layer 140'.

Figure 8:
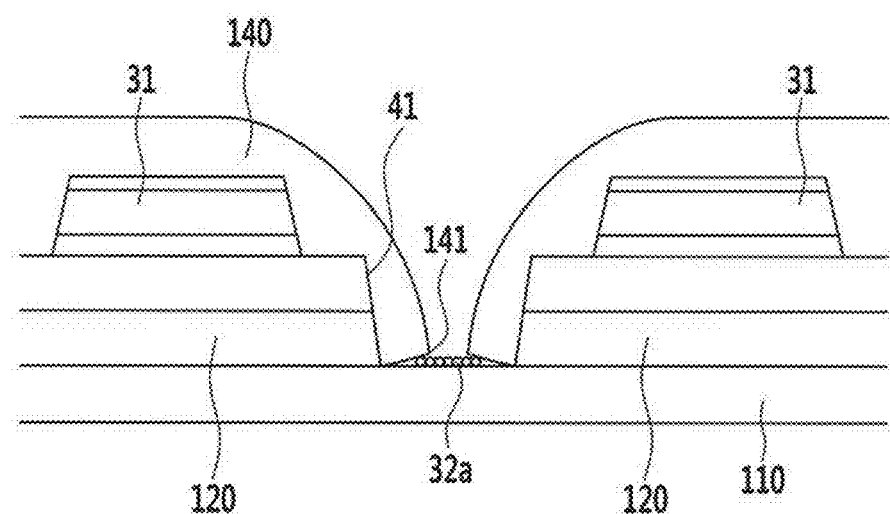
FIG. 8 is a cross-sectional view of a boundary portion of an insulating layer of a display device according to an exemplary embodiment of the present invention.

Next, the edge of the second insulating layer 140 of the display device according to an exemplary embodiment of the present invention will be described with reference to FIG. 8. FIG. 8 is a cross-sectional view of a boundary portion of an insulating layer of a display device according to an exemplary embodiment of the present invention.

As shown in FIG. 8, in the display device according to an exempla embodiment of the present invention, the edge portion 141 disposed between two adjacent driving signal transmission lines 31 among the edge of the second insulating layer 140 disposed on the first insulating layer 130 overlaps the trench 41 formed in the first insulating layer 130 and the gate insulating layer 120 disposed under the first insulating layer 130.

Accordingly, although the edge portion 141 disposed between two adjacent driving signal transmission lines 31 among the edge of the second insulating layer 140 may be lifted, the separation portion of the edge portion 141 of the lifted second insulating layer 140 is disposed in the trench 41 formed in the gate insulating layer 120 and the first insulating layer 130 disposed under the second insulating layer 140. Accordingly, the height of the lower surface of the edge portion 141 of the second, insulating layer 140 is lower than the surface height of the first insulating layer 130. Accordingly, although the metal nanoparticles 32a remaining under the edge portion 141 of the second insulating layer 140 may be spread by the dendrite phenomenon, the metal nanoparticles 32a may not meet the driving signal transmission line 31 disposed on the first insulating layer 130. Accordingly, although the metal nanoparticles 32a remaining under the edge portion 141 of the second insulating layer 140 may be spread, the adjacent driving signal transmission lines 31 may be prevented or substantially prevented from being shorted to each other.

Figure 9:
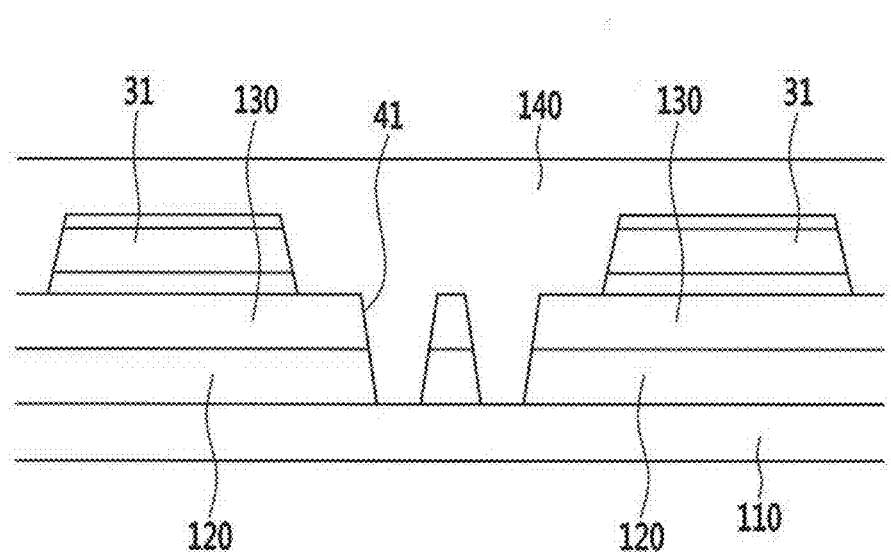
FIG. 9 is a cross-sectional view of a display device according to another exemplary embodiment of the present invention, taken along the line II-II of FIG. 1.

Next, a display device according to another exemplary embodiment of the present invention will be described with reference to FIG. 9 and FIG. 10, as well as FIG. 1. FIG. 9 is a cross-sectional view of a display device according to another exemplary embodiment of the present invention, taken along the line II-II of FIG. 1; and FIG. 10 is a cross-sectional view of a display device according to another exemplary embodiment of the present invention, taken along the line III-III of FIG. 1.

Figure 10:
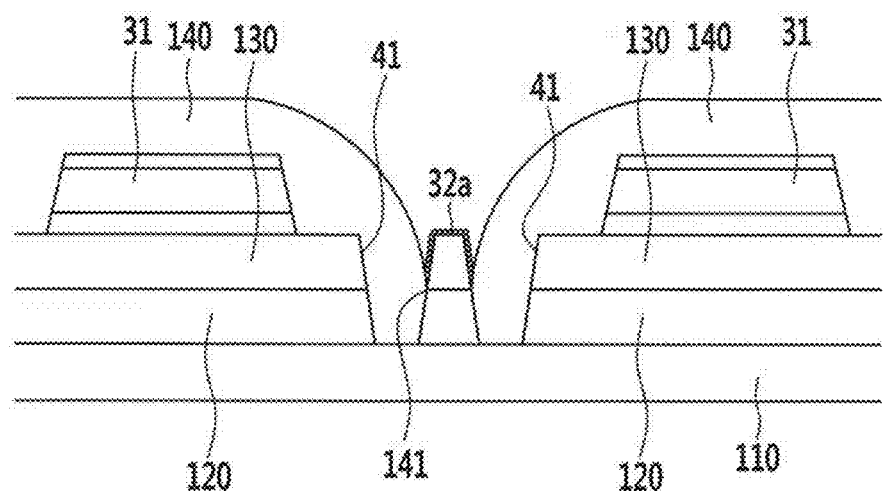
FIG. 10 is a cross-sectional view of a display device according to another exemplary embodiment of the present invention, taken along the line III-III of FIG. 1.

Referring to FIG. 9 and FIG. 10 along with FIG. 1, the display device according to another exemplary embodiment of the present invention is similar to the display device according to the exemplary embodiment described above with reference to FIG. 1 to FIG. 3 and FIG. 8. Therefore, a detailed description of the similar constituent elements is omitted.

The display device according to the present exemplary embodiment includes the display area 100 including the plurality of pixels PX, the driver 200 disposed around the display area 100 and transmitting the driving signal to the display area 100, and the plurality of driving signal transmission lines 31 disposed between the display area 100 and the driver 200.

The gate insulating layer 120 is disposed on the insulation substrate 110, and the first it insulating layer 130 is disposed on the gate insulating layer 120. The plurality of driving signal transmission lines 31 is disposed on the first insulating layer 130. Each of the plurality of driving signal transmission lines 31 may include the first film 31p, the second film 31q disposed on the first film 31p, and the third film 31r disposed on the second film 31q. The first film 31p and the third film 31r may include titanium (Ti), and the second film 31q may include silver (Ag).

The second insulating layer 140 is disposed on the display area 100 and the portion of the driving signal transmission lines 31. The gate insulating layer 120 and the first insulating layer 130 include a plurality of trenches 41 between two driving signal transmission lines 31 that are adjacent to each other and overlapping the edge of the second insulating layer 140.

In an exemplary embodiment, the plurality of trenches 41 overlap the edge portion 141 of the second insulating layer 140 disposed between two driving signal transmission lines 31 adjacent to each other, the trenches 41 are disposed between the two adjacent driving signal transmission lines 31, and the trenches 41 are disposed in the gate insulating layer 120 and the first insulating layer 130.

Accordingly, at least a portion of the edge portion 141 of the second insulating layer 140 disposed between two adjacent driving signal transmission lines 31 among the edge of the second insulating layer 140 disposed on the portion on the driving signal transmission line 31 is disposed in a plurality of trenches 41.

In this way, since at least a portion of the edge portion 141 of the second insulating layer 140 disposed between two adjacent driving signal transmission lines 31 is disposed in the plurality of trenches 41 formed in the gate insulating layer 120 and the first insulating layer 130 disposed under the driving signal transmission line 31, the lower surface height of at least a portion of the edge portion 141 of the second insulating layer 140 disposed between the two adjacent driving signal transmission lines 31 is lower than the surface of the first insulating layer 130. Accordingly, although the edge portion 141 of the second insulating layer 140 disposed between two adjacent driving signal transmission lines 31 may be lifted, at least a portion of the edge portion 141 of the second insulating layer 140 disposed between two adjacent driving signal transmission lines 31 is not lifted to be higher than the surface height of the first insulating layer 130.

Accordingly, the nanoparticles 32a remaining near the edge portion 141 are not diffused to two adjacent driving signal transmission lines 31 by a stepped portion between the plurality of trenches 41.

In this way, although the metal nanoparticles 32a remaining near the edge of the second insulating layer 130 disposed between two adjacent driving signal transmission lines 31 may be diffused by the dendrite phenomenon, the metal nanoparticles 32a may not meet the driving signal transmission line 31 disposed on the first insulating layer 130 because of the stepped portions between the plurality of trenches 41. Accordingly, although the metal nanoparticles 32a remaining at the position near the edge portion 141 of the second insulating layer 140 may be diffused, the adjacent driving, signal transmission lines 31 may be prevented or substantially prevented from being shorted to each other.

Features of the display device according to the exemplary embodiment described with reference to FIG. 1 to FIG. 3 and FIG. 8 may be applied to the display device according to the present exemplary embodiment.

Figure 11:
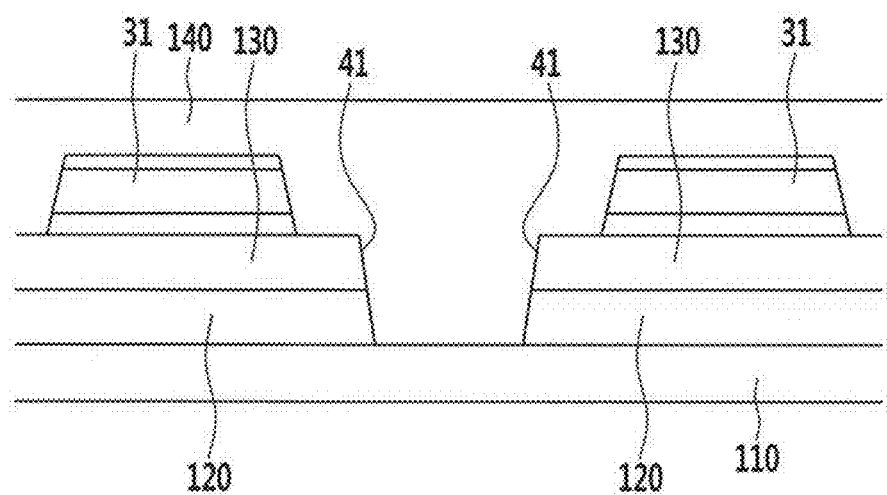
FIG. 11 is a cross-sectional view of a display device according to another exemplary embodiment of the present invention, taken along the II-II of FIG. 1.

Next, a display device according to another exemplary embodiment of the present invention will be described with reference to FIG. 11 and FIG. 12 as well as FIG. 1. FIG. 11 is a cross-sectional view of a display device according to another exemplary embodiment of the present invention, taken along the line II-II of FIG. 1; and FIG. 12 is a cross-sectional view of a display device according to another exemplary embodiment of the present invention, taken along the line III-III of FIG. 1.

Figure 12:
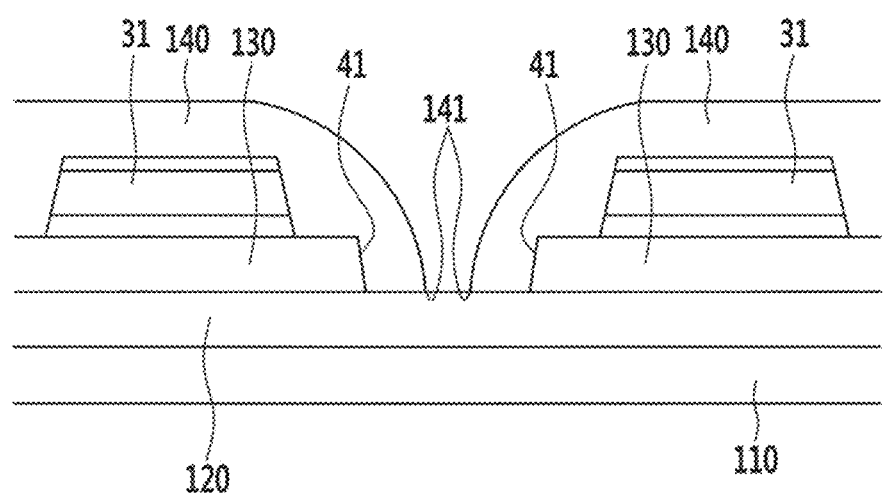
FIG. 12 is a cross-sectional view of a display device according to another exemplary embodiment of the present invention, taken along the line III-III of FIG. 1.

Referring to FIG. 11 and FIG. 12 as well as FIG. 1, the display device according to another exemplary embodiment of the present invention is similar to the display device according to the exemplary embodiment described above with reference to FIG. 1 to FIG. 3 and FIG. 8. Therefore, a detailed description of the similar constituent elements is omitted.

The display device according to the present exemplary embodiment include the display area 100 including the plurality of pixels PX, the driver 200 disposed near the display area 100 and transmitting the driving signals to the display area 100, and the plurality of driving signal transmission lines 31 disposed between the display area 100 and the driver 200.

The gate insulating layer 120 is disposed on the insulation substrate 110, and the first insulating layer 130 is disposed on the gate insulating layer 120. The plurality of driving signal transmission lines 31 is disposed on the first insulating layer 130. Each of the plurality of driving signal transmission lines 31 may include the first film 31p, the second film 31q disposed on the first film 31p, and the third film 31r disposed on the second film 31q. The first film 31p and the third film 31r may include titanium (Ti), and the second film 31q may include silver (Ag).

The second insulating layer 140 is disposed on the display area 100 and a portion of the driving signal transmission lines 31. The first insulating layer 130 disposed under the second insulating layer 140 includes the trench 41 disposed between two driving signal transmission lines 31 adjacent to each other and overlapping the edge of the second insulating layer 140.

In an exemplary embodiment, the trench 41 overlaps the edge portion 141 of the second insulating layer 140 disposed between two adjacent driving signal transmission lines 31, the trench 41 is disposed between two adjacent driving signal transmission lines 31, and the trench 41 is formed in the first insulating layer 130.

Accordingly, at least a portion among the edge portion 141 of the second insulating layer 140 disposed between two adjacent driving signal transmission lines 31 among the edge of the second insulating layer 140 disposed on the portion on the driving signal transmission lines 31 is disposed in the trench 41.

In this way, since at least a portion of the edge portion 141 of the second insulating layer 140 disposed between two adjacent driving signal transmission lines 31 is disposed in the trench 41 formed in the first insulating layer 130 disposed under the driving signal transmission lines 31, the lower surface height of at least a portion of the edge portion 141 of the second insulating layer 140 disposed between the two adjacent driving signal transmission lines 31 is lower than the surface of the first insulating layer 130. Accordingly, although the edge portion 141 of the second insulating layer 140 disposed between two adjacent driving signal transmission lines 31 may be lifted, at least a portion of the edge portion 141 of the second insulating layer 140 disposed between the two adjacent driving signal transmission lines 31 is not lifted to be higher than the surface height of the first insulating layer 130.

Accordingly, the nanoparticles 32a remaining near the edge portion 141 are not diffused to the two adjacent driving signal transmission lines 31 by the step of the trench 41.

As described above, although the metal nanoparticles 32a remaining at the position near the edge of the second insulating layer 130 disposed between two adjacent driving signal transmission lines 31 may be diffused by the dendrite phenomenon, the metal nanoparticles 32a do not meet the driving signal transmission line 31 disposed on the first insulating layer 130 by the step of the trench 41. Accordingly, although the metal nanoparticles 32a remaining at the position near the edge portion 141 of the second insulating layer 140 may be diffused, the adjacent driving signal transmission lines 31 may be, prevented or substantially prevented from being shorted to each other.

Features of the display devices according to the exemplary embodiment described with reference to FIG. 1 to FIG. 3 and FIG. 8, FIG. 9, and FIG. 10 may be applied to the display device according to the present exemplary embodiment.

Now, a manufacturing method of the display device according to the exemplary embodiment will be described with reference to FIG. 1 to FIG. 3 and FIG. 8.

A gate insulating layer 120 is formed on an insulation substrate 110, and a first insulating layer 130 is formed on the gate insulating layer 120. The plurality of driving signal transmission lines 31 is formed on the first insulating layer 130. Each of the plurality of driving signal transmission lines 31 may include a first film 31p, a second film 31q formed on the first film 31p, and a third film 31r formed, on the second film 31q. The first film 31p and the third film 31r may include titanium (Ti), and the second film 31q may include silver (Ag). A second insulating layer 140 is formed on the display area 100 and a portion of the driving signal transmission lines 31. Then, a trench 41 is formed in the gate insulating layer 120 and the first insulating layer 130 and the trench 41 is formed between two driving signal transmission lines 31 adjacent to each other and overlapping an edge of the second insulating layer 140. A surface height of the edge portion 141 of the second insulating layer 140 disposed between the two adjacent driving signal transmission lines 31 is lower than the surface of the first insulating layer 130.

Then, although not shown, an additional layer may be formed on the second insulating layer 140. In here, a portion of the driving signal transmission lines 31 may be etched with an etchant using in forming the additional layer and the metal nanoparticles 32a may be formed and spread by the dendrite phenomenon. However, according to the manufacturing method of the display device according to the exemplary embodiment, the height of the lower surface of the edge portion 141 of the second insulating layer 140 is lower than the surface height of the first insulating layer 130 and therefore the metal nanoparticles 32a may not meet the driving signal transmission line 31 formed on the first insulating layer 130. Accordingly, although the metal nanoparticles 32a remaining under the edge portion 141 of the second insulating layer 140 may be spread, the adjacent driving signal transmission lines 31 may be prevented or substantially prevented from being shorted to each other.

While this invention has been described in connection with at is presently considered to be some practical exemplary embodiments, it is to be understood that the invention is not limited to the disclosed embodiments, but, on the contrary, is intended to cover various modifications and equivalent arrangements included within the spirit and scope of the appended claims and equivalents thereof.

What is claimed is:

1. A display device comprising:
    a first substrate comprising a display area including a plurality of pixels, and a peripheral area around the display area;
    a plurality of driving signal transmission lines on the first substrate and arranged in the peripheral area;
    a first insulating layer on the first substrate and arranged under the plurality of driving signal transmission lines; and
    a second insulating layer on a portion of the plurality of driving signal transmission lines and arranged in the display area,
    wherein the first insulating layer includes a trench between two driving signal transmission lines adjacent to each other among the plurality of driving signal transmission lines, and
    wherein an edge portion of the second insulating layer overlaps the trench.

2. The display device of claim 1, wherein the driving signal transmission lines comprise silver (Ag).

3. The display device of claim 2,
    wherein each of the driving signal transmission lines includes a first film, a second film on the first film, and a third film on the second film, and
    wherein the second film comprises silver (Ag).

4. The display device of claim 3, wherein the first film and the third film comprise titanium (Ti).

5. The display device of claim 4, further comprising a data line on the first substrate, wherein a driving signal transmission line of the plurality of driving signal transmission lines is connected to the data line.

6. The display device of claim 1,
    wherein the trench formed in the first insulating layer is in plural, and
    wherein the edge portion of the second insulating layer is in plural and overlaps at least a portion of the plurality of trenches.

7. The display device of claim 6, wherein the driving signal transmission lines comprise silver (Ag).

8. The display device of claim 7,
    wherein each of the driving signal transmission lines includes a first film, a second film on the first film, and a third film on the second film, and
    wherein the second film comprises silver (Ag).

9. The display device of claim 8, wherein the first film and the third film comprise titanium (Ti).

10. The display device of claim 9, further comprising a data line formed on the first substrate, wherein a driving signal transmission line of the plurality of driving signal transmission lines is connected to the data line.

11. A manufacturing method of a display device comprising:
    forming a first insulating layer on a first substrate comprising a display area including a plurality of pixels, and a peripheral area around the display area;
    forming a plurality of driving signal transmission lines on the first substrate and arranged in the peripheral area, the first insulating layer arranged under the plurality of driving signal transmission lines;
    forming a trench in the first insulating layer, the trench between two driving signal transmission lines adjacent to each other among the plurality of driving signal transmission lines; and
    forming a second insulating layer on a portion of the plurality of driving signal transmission lines, the second insulating layer arranged in the display area and including an edge portion overlapping the trench.

12. The manufacturing method of claim 11, wherein the driving signal transmission lines comprise silver (Ag).

13. The manufacturing method of claim 12,
    wherein each of the driving signal transmission lines includes a first film, a second film on the first film, and a third film on the second film, and
    wherein the second film comprises silver (Ag).

14. The manufacturing method of claim 13, wherein the first film and the third film comprise titanium (Ti).

15. The manufacturing method of claim 14, further comprising forming a data line on the first substrate, wherein a driving signal transmission line of the plurality of driving signal transmission lines is connected to the data line.

16. The manufacturing method of claim 11,
    wherein the forming of the trench comprises forming a plurality of trenches in the first insulating layer, and
    wherein the second insulating layer is formed to have plural edges overlapping at least a portion of the plurality of trenches.

17. The manufacturing method of claim 16, wherein the driving signal transmission lines comprise silver (Ag).

18. The manufacturing method of claim 17,
    wherein each of the driving signal transmission lines includes a first film, a second film on the first film, and a third film on the second film, and
    wherein the second film comprises silver (Ag).

19. The manufacturing method of claim 18, wherein the first film and the third film comprise titanium (Ti).

20. The manufacturing method of claim 19, further comprising forming a data line on the first substrate, wherein a driving signal transmission line of the plurality of driving signal transmission lines is connected to the data line.

* * * * *